US006974781B2

(12) United States Patent
Timmermans et al.

(10) Patent No.: US 6,974,781 B2
(45) Date of Patent: Dec. 13, 2005

(54) REACTOR PRECOATING FOR REDUCED STRESS AND UNIFORM CVD

(75) Inventors: Eric A. H. Timmermans, Eindhoven (NL); Maarten J. Teepen, Bilthoven (NL); Raffaele Mucciato, Rome (IT); Rudi Wilhelm, Bilthoven (NL)

(73) Assignee: ASM International N.V., Bilthoven (NL)

( * ) Notice: Subject to any disclaimer, the term of this patent is extended or adjusted under 35 U.S.C. 154(b) by 41 days.

(21) Appl. No.: 10/690,215

(22) Filed: Oct. 20, 2003

(65) Prior Publication Data

US 2005/0085098 A1 Apr. 21, 2005

(51) Int. Cl.$^7$ .................. H01L 21/31; H01L 21/469
(52) U.S. Cl. ................ 438/794; 427/255.394
(58) Field of Search ................ 438/758, 778, 438/779–784, 791–794; 427/255.28, 255.39, 255.393, 255.394

(56) References Cited

U.S. PATENT DOCUMENTS

| | | |
|---|---|---|
| 3,011,006 A | 11/1961 | Nicholson et al. |
| 3,874,919 A | 4/1975 | Lehman |
| 4,374,158 A | 2/1983 | Taniguchi et al. |
| 4,377,347 A | 3/1983 | Hanmyo et al. |
| 4,389,967 A | 6/1983 | Shimoda et al. |
| 4,428,975 A | 1/1984 | Dahm et al. |
| 4,499,354 A | 2/1985 | Hill et al. |
| 4,522,849 A | 6/1985 | Lewandowski |
| 4,592,307 A | 6/1986 | Jolly |
| 4,633,051 A | 12/1986 | Olson |
| 4,653,428 A | 3/1987 | Wilson et al. |
| 4,692,556 A | 9/1987 | Bollen et al. |
| 4,976,996 A | 12/1990 | Monkowski et al. |
| 4,978,567 A | 12/1990 | Miller |
| 4,984,904 A | 1/1991 | Nakano et al. |

(Continued)

FOREIGN PATENT DOCUMENTS

| | | |
|---|---|---|
| EP | 0 229 488 | 7/1987 |
| WO | WO 95/31582 | 11/1995 |
| WO | WO 97/06288 | 2/1997 |
| WO | WO 99/23276 | 5/1999 |

OTHER PUBLICATIONS

Linke et al., "Behavior of Boron–Doped Graphites, Plasma–Sprayed $B_4C_1$ and a–C/B:H as Plasma–Facing Materials," *Fusion Technology*, vol. 20, (Sep. 1991), pp. 227–230.
Moslehi et al., "Compositional Studies of Thermally Nitrided Silicon Dioxide (Nitroxide)," *J. Electrochem Soc.*, vol. 132, No. 9, pp. 2189–2197 (Sep. 1985).
Murarka et al., "Thermal Nitridation of Silicon in Ammonia Gas: Composition and Oxidation Resistance of the Resulting Films," *J. Electrochem. Soc.*, vol. 126, No. 6, pp. 996–1003 (Jun. 1979).
Ponnekanti et al., "Failure mechanisms of anodized aluminum parts used in chemical vapor deposition chambers," *J. Vac. Sci. Technol*, vol. 14, No. 3, (May/Jun. 1996), pp. 1127–1131.

*Primary Examiner*—Evan Pert
(74) *Attorney, Agent, or Firm*—Knobbe Martens Olson & Bear LLP

(57) ABSTRACT

A method is provided for obtaining stable and elevated deposition rates in a reaction chamber, following the cleaning of the chamber. The method involves cleaning of the chamber, pre-coating the interior surfaces of the reaction chamber with an inorganic composition, and then, using the pre-coated chamber to deposit an organic layer onto a workpiece.

20 Claims, 1 Drawing Sheet

BTBAS nitride deposition runs after in-situ clean

U.S. PATENT DOCUMENTS

| | | |
|---|---|---|
| 5,027,746 A | 7/1991 | Frijlink |
| 5,065,698 A | 11/1991 | Koike |
| 5,104,514 A | 4/1992 | Quartarone |
| 5,129,958 A | 7/1992 | Nagashima et al. |
| 5,246,500 A | 9/1993 | Samata et al. |
| 5,271,967 A | 12/1993 | Kramer et al. |
| 5,315,092 A | 5/1994 | Takahashi et al. |
| 5,336,327 A | 8/1994 | Lee |
| 5,360,269 A | 11/1994 | Ogawa et al. |
| 5,421,893 A | 6/1995 | Perlov |
| 5,456,761 A | 10/1995 | Auger et al. |
| 5,474,618 A | 12/1995 | Allaire |
| 5,493,987 A | 2/1996 | McDiarmid et al. |
| 5,514,439 A | 5/1996 | Sibley |
| 5,562,774 A | 10/1996 | Breidenbach et al. |
| 5,571,333 A | 11/1996 | Kanaya |
| 5,594,482 A | 1/1997 | Ohashi |
| 5,728,629 A | 3/1998 | Mizuno et al. |
| 5,788,799 A | 8/1998 | Steger et al. |
| 5,798,016 A | 8/1998 | Oehrlein et al. |
| 5,874,368 A | 2/1999 | Laxman et al. |
| 5,902,407 A | 5/1999 | De Boer et al. |
| 5,904,778 A | 5/1999 | Lu et al. |
| 5,910,221 A | 6/1999 | Wu |
| 6,056,823 A | 5/2000 | Sajoto et al. |
| 6,066,209 A | 5/2000 | Sajoto et al. |
| 6,071,573 A | 6/2000 | Koemtzopoulos et al. |
| 6,120,640 A | 9/2000 | Shih et al. |
| 6,129,808 A | 10/2000 | Wicker et al. |
| 6,170,429 B1 | 1/2001 | Schoepp et al. |
| 6,214,425 B1 | 4/2001 | Spinelli et al. |
| 6,227,140 B1 | 5/2001 | Kennedy et al. |
| 6,325,857 B1 | 12/2001 | Miyoshi |
| 6,325,858 B1 | 12/2001 | Wengert et al. |
| 6,342,691 B1 | 1/2002 | Johnsgard et al. |
| 2003/0035905 A1 | 2/2003 | Lieberman et al. |
| 2003/0215963 A1 | 11/2003 | AmRhein et al. |

REACTOR PRECOATING FOR REDUCED STRESS AND UNIFORM CVD

FIELD OF THE INVENTION

The invention relates generally to the field of semiconductor processing; and more particularly, to the field of nitride film deposition on semiconductor substrates.

BACKGROUND OF THE INVENTION

Recently, a process for the low pressure chemical vapor deposition (LPCVD) of silicon nitride films from ammonia and bis-tertiary-butyl amino silane (BTBAS), having the formula $(t-C_4H_9NH)_2SiH_2$, has been proposed in U.S. Pat. No. 5,874,368 to Laxman. In addition to improved film properties, a significantly lower deposition temperature can be used as compared to a conventional process using ammonia and dichlorosilane (DCS), subjecting the semiconductor substrates to a significantly lower thermal budget. The process is operated in a conventional vertical furnace wherein a plurality of wafers, accommodated in a wafer boat in a horizontal position and in a vertically spaced relationship, are processed in a quartz process tube.

However, this BTBAS process has a large disadvantage. After a few deposition runs, or a limited cumulative film thickness of about 300 nm on the quartz process tube and the quartz wafer boat, the particle levels in the process tube start to increase to unacceptably high levels. In order to reduce the particle levels, the quartzware needs to be cleaned, and cleaned relatively frequently. Due to the high frequency of cleaning, this manufacturing process is only economical when the cleaning can be performed in-situ, by feeding a cleaning gas into the process tube, without a need to dismount the process tube for each cleaning. One frequently used cleaning gas is $NF_3$. Unfortunately, after cleaning with $NF_3$, the deposition rate of the BTBAS process appears to be significantly lower than before the cleaning, perhaps due to undesirable roughening of the exposed quartz surfaces. This effect can be counteracted by performing a pre-coating run using BTBAS without product wafers in the process tube. However, the pre-coating run contributes to the allowable cumulative deposition before a new in-situ cleaning becomes necessary. Thus, using BTBAS is counterproductive since it reduces the number of production runs that can be performed between cleanings.

SUMMARY OF THE INVENTION

In accordance with one aspect of the invention, a method is provided to reduce the loss in deposition rate following the cleaning of a reaction chamber comprising the steps of: cleaning the reaction chamber; precoating the reaction chamber with silicon nitride using an inorganic silicon reactant and a nitrogen source; and depositing silicon nitride on a workpiece using an organic silicon reactant.

In accordance with another aspect of the invention, a method is provided for treating quartz materials to maintain a relatively constant deposition rate on wafers. The method includes administrating a dichlorosilane-based (DCS-based) silicon nitride pre-coat to quartz materials. A wafer is loaded into a reaction chamber having the pre-coated quartz materials. A film is then deposited onto the wafer using an organic silicon precursor.

In accordance with another aspect of the invention, a method is provided for the operation of a reaction chamber for the deposition of silicon nitride films on semiconductor substrates comprising the steps of: a) carrying out a number of silicon nitride deposition runs on semiconductor wafers in the reaction chamber, using a nitrogen source and bis-tertiary-butyl amino silane (BTBAS) as precursors; b) after building up a cumulative BTBAS-based nitride thickness on parts of the reaction chamber, performing an in-situ clean of the reaction chamber by feeding a cleaning gas into the reaction chamber; c) depositing a nitride pre-coating on the cleaned reaction chamber using a nitrogen source and dichlorosilane (DCS) as precursors; and d) re-starting the cycle of steps a), b), c), and d) in sequence.

An advantage of the preferred embodiments is to provide a method for the operation of a reaction chamber for the deposition of nitride films using BTBAS and ammonia as precursors, that allows for the performance of an economically feasible number of production runs between cleaning cycles. Another advantage is that the pre-coating method is effective for increasing and maintaining the deposition rate of low temperature depositions, following a cleaning of the reaction chamber.

DETAILED DESCRIPTION OF THE PREFERRED EMBODIMENT

Figure 1:
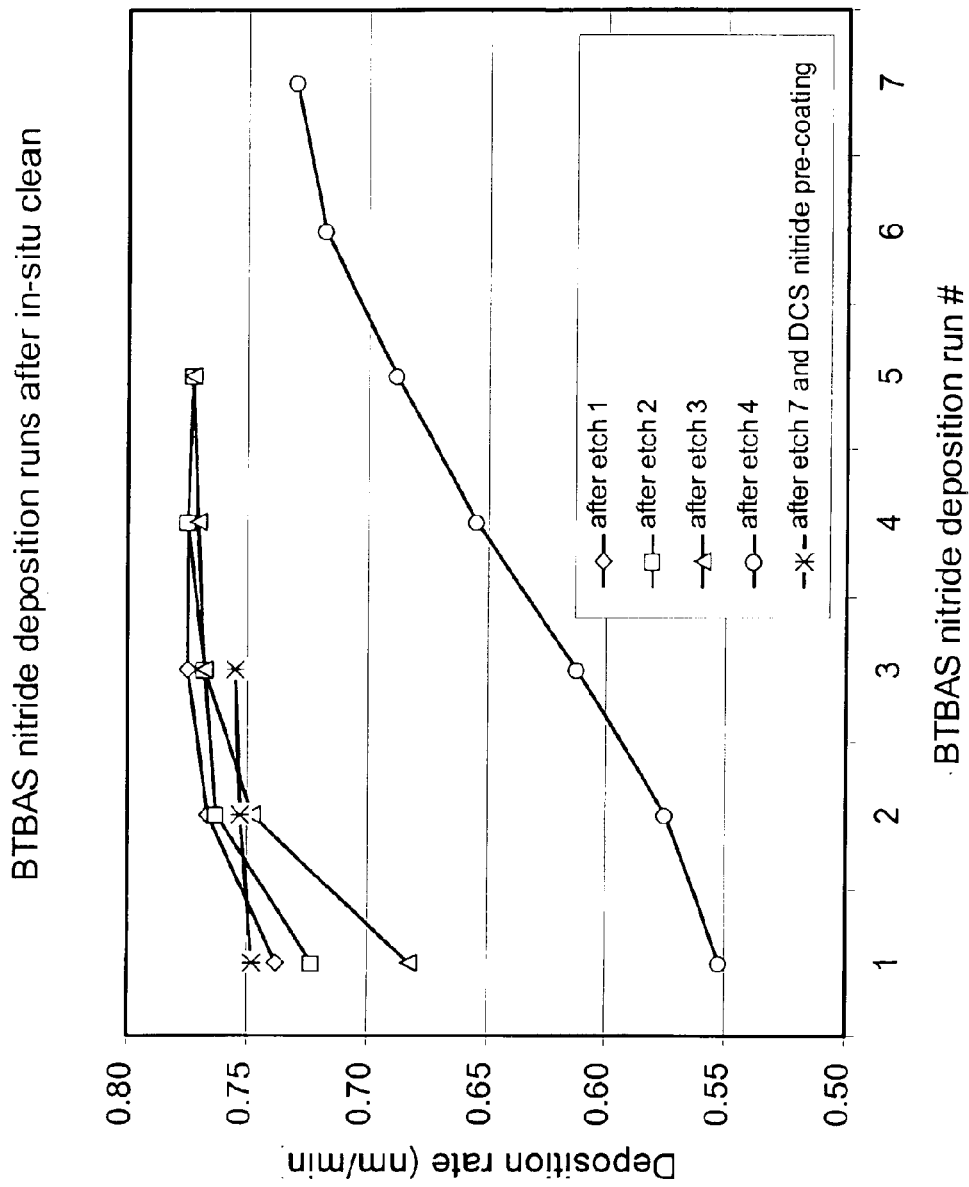
FIG. 1 shows the deposition rates for a number of bis-tertiary-butyl amino silane (BTBAS) nitride deposition runs following an in-situ clean.

In one embodiment, a method is provided for deposition of silicon nitride films workpieces or substrates in a plurality of runs using an organic silicon source, and particularly bis-tertiary-butyl amino silane (BTBAS). This embodiment will be described in further detail with reference to FIG. 1. FIG. 1 shows the deposition rate for a series of consecutive BTBAS-based nitride deposition runs. Prior to each series, an in-situ cleaning was performed on the quartz process tube and the quartz wafer boat that accommodates the wafers in a vertically spaced relationship. Quartz rings were disposed directly below each wafer to improve the uniformity of the BTBAS-based deposition over each wafer. At the start of the experiments shown in FIG. 1, the quartzware was new and unused. A first series of four depositions of a thickness of 60 nm to 80 nm each was carried out. During this series the process conditions, in particular the temperatures of five heating zones in a vertical batch processing furnace, were adjusted to improve the uniformity of the deposition process over the wafers along the height of the wafer boat. These first results are not shown in FIG. 1.

Following the initial BTBAS-based depositions on wafers, an in-situ cleaning was performed using $NF_3$ as the cleaning gas. The wafer boat and quartz rings were cleaned simultaneously with the process tube. The $NF_3$ cleaning was thermally activated and performed in a temperature range between 500° C. and 600° C., using a mixture of $NF_3$ and $N_2$. The in-situ cleaning time was in the range of 20 to 30 min. Alternatively, plasma activation of the $NF_3$ or any other form of non-thermal activation known in the art can be applied. The organic-based nitride deposition is preferably conducted below about 650° C. The BTBAS deposition process was carried out at a temperature of about 600° C., using BTBAS and a supplemental nitrogen source, specifically $NH_3$, as reactants. Note that BTBAS is an organic source for both silicon and nitrogen, such that it is possible to omit the supplemental nitrogen source. The deposited film thickness per run was in the range of 60 nm to 80 nm. This deposition tends to coat not only the wafers but also internal quartz parts, such as the furnace vessel and the boat, as well as quartz or ceramic support rings in the boat slots in some arrangements.

As shown in FIG. 1, in the series of runs performed after the first etch, the deposition rate for the first run was relatively low and increased in the subsequent runs until a saturation level of about 0.775 nm/min was achieved. This decreased deposition rate and slow recovery became more pronounced following each subsequent etch step between runs. Indeed, in the event of prolonged periods of cleaning, the effect became very pronounced. The effect of such a prolonged period of cleaning is demonstrated by the deposition rate of the BTBAS-derived films following the fourth etch, in FIG. 1. Heavy over-etching resulted from prolonged exposure of the quartz material to the $NF_3$ etching gas. As a result, the series of deposition runs after etch 4 demonstrated a strongly reduced deposition rate which only slowly recovered during successive applications of the BTBAS-based silicon nitride film. The deposition series after etch 5 and 6 showed similar behavior, although the data is not presented in FIG. 1. Such a variable deposition rate is not acceptable in a production environment, which emphasizes speed, consistency, and reliability. Additionally, the decrease in deposition rates translates into a longer production time for each workpiece, also adding cost and time to the process.

Without being limited by theory, the most likely explanation for this behavior is that there is an increase in surface roughness of the quartz material, which roughness occurs due to the $NF_3$ in the in-situ cleaning, or etching, process. This increase in roughness translates into an increase in possible deposition surface area. Thus, since the surface area has increased, but the other characteristics of the device remain unchanged, the deposition rate on the substrates or workpieces accordingly decreases, as more precursor is consumed by deposition on the higher surface area quartz parts.

Without being limited by theory, the inventors hypothesize that the reason each of the progressive runs result in higher deposition rates is that the roughness is reduced by depositing a film over the rough area. The valleys and pits in the surface are gradually filled with increasing film thickness. While it is desirable to reduce over-etching to a minimum, one cannot completely avoid over-etching. This is primarily because the previously deposited nitride film needs to be completely removed to ensure the performance of the process over a number of cycles of in-situ cleans and series of deposition runs between the cleanings.

In one preferred embodiment, a new nitride film is deposited over the freshly etched reaction chamber, including anything that was cleaned in the reaction chamber. Thus, the deposition rate is not reduced as much following a cleaning of the reaction chamber. Preferably, the roughness due to etching is reduced by applying a film over any etched parts, but the film does not contribute to the particle levels in the chamber. The pre-coating film is preferably deposited by chemical vapor deposition using an inorganic silicon source. In a more preferred embodiment, the pre-coating film uses both an inorganic silicon source and an inorganic nitrogen source. Preferably the pre-coating process is conducted at approximately 700° C. or greater. In the illustrated embodiment, the film pre-coat is produced from dichlorosilane (DCS) and ammonia while the film deposited onto the workpiece(s) is produced from BTBAS and ammonia.

An example of the result of using the method of one preferred embodiment of the current invention is demonstrated in FIG. 1. While the deposition rate of the BTBAS-based nitride following each cleaning had been approximately 0.55 nm/min for the first run following the fourth etching, the deposition rate of BTBAS-based nitride following the seventh etching and a DCS-based nitride pre-coating, resulted in an initial deposition rate of approximately 0.75 nm/min. In this embodiment, after the seventh in-situ etch a silicon nitride pre-coating was deposited on the quartzware, in this case the process tube, boat, and support rings, using ammonia and DCS as precursors. The process conditions for the precoating process were as follows: temperature 750° C. to 780° C., DCS flow=80 sccm, $NH_3$ flow=280 sccm, pressure=235 mTorr. A film of about 300 nm thickness was deposited in 150 min. One of skill in the art will appreciate how these variables can differ according to the particular reaction chamber designs.

FIG. 1 demonstrates several surprising results of the preferred embodiment. First, the deposition rate following the seventh etch cycle and the DCS pre-coating treatment is superior to the deposition rate following even the first etch cycle without the DCS pre-coat. This demonstrates the incredible effectiveness of this embodiment.

Second, the consistency of the deposition rates between each of the successive runs demonstrates that this method allows one to obtain deposition rates with a very high level of reproducibility. This is particularly surprising since only a single treatment with DCS resulted in such a stable system. A comparison of the reproducibility of the deposition rates between pre-coating using DCS and "pre-coating" the chamber and internal parts using BTBAS demonstrates the ability of the DCS-based pre-coat films to produce a much more stable system. FIG. 1 shows that in the deposition series after etch 4, using BTBAS as the precursor for both the pre-coating and for the deposition onto the substrates; the deposition rate appears to still be rising, perhaps even after the seventh run, which would equate to approximately 490 nm of cumulative film thickness. Thus, a BTBAS-based "precoating" is unable to achieve a steady deposition rate even after 490 nm of film thickness, a thickness of BTBAS-based nitride that already requires a new round of chamber cleaning due to excessive particle generation. However, the DCS-based nitride pre-coating process resulted in a relatively constant deposition rate of BTBAS-based nitride following a single, although thicker, pre-coating. Notably, this was achieved after a DCS-based nitride precoating of only 300 mm, rather than the 490 nm of the BTBAS-based pre-coat.

An additional surprising result is that the DCS-based nitride film thickness seems to have no significant influence on the allowable thickness of BTBAS-based nitride film, as far as cleaning of the chamber is concerned. That is, the extra thickness created by the DCS-based pre-coating is not an important factor in determining when degradation of the particle performance will occur and when an additional cleaning will be required. Thus, the extra thickness provided by the DCS-based film helps to smooth the roughness from the etching, without reducing the amount of BTBAS-based film one can add during deposition runs. This is in agreement with the much larger tolerable film thickness of DCS-based nitride, 30 $\mu$m or more, which can be deposited in a reaction chamber before cleaning is needed. Without being limited by theory, the inventors believe that the reason a greater thickness of DCS-based nitride is permissible over BTBAS-based nitride is that DCS is an inorganic compound. That is, it is the carbon and hydrogen in the BTBAS reactant that makes the BTBAS-based films susceptible to stress and flaking, and thus require cleaning of the reaction chamber frequently.

As one of skill in the art will recognize, in light of the present disclosure, the DCS-based nitride pre-coating thickness that achieves stable BTBAS process performance depends on the condition of the reaction chamber, any quartzware that is part of the process, the number of etches already performed, the degree of over-etching, and many other factors. In a preferred embodiment, the thickness of the pre-coating is estimated to be 50 nm or more. More preferably, the thickness of the pre-coating is in the range of 100 nm to 500 mm.

"Reaction chamber," as used herein, generally refers to the exposed surface of an environment where the deposition from vapor phase reactants onto a workpiece is to occur. This includes any surface that is exposed to at least one of the following: the precoating reactants, the product or deposition run reactants, or the cleaning gases. Thus, "reaction chamber," according to one preferred embodiment, encompasses not only the shell of the chamber itself, but also any quartzware or any other objects, that may also be exposed to the pre-coating reactants, product reactants, or cleaning gases. A "processing chamber" or other area where a deposition is to occur is defined similarly. "Reaction chamber" does not include the workpiece itself. In one preferred embodiment, a reaction chamber comprises a quartz process tube. In a more preferred embodiment, the reaction chamber also comprises a wafer boat. In a more preferred embodiment, the reaction chamber comprises a quartz process tube, a wafer boat, and a quartz ring or other support structure.

As one of skill in the art will recognize, the reaction chamber and other pieces of equipment which may benefit from cleaning and thus pre-coating with the film of the preferred embodiments, can be made from many different materials, including, but not limited to the following: ceramic materials, such as alumina, anodized coatings, and silicon nitride; metals, such as, aluminum, and stainless steel; quartz; and other dielectric materials. The reaction chamber of the preferred embodiments was made of quartz material. In an alternative embodiment, the reaction chamber is made from silicon carbide. In another embodiment the reaction chamber is made from silicon impregnated silicon carbide, graphite, or other ceramic materials.

The pre-coating step comprises a deposition, using the pre-coating reactant, onto the reaction chamber. Pre-coating is performed when there is no workpiece in he reaction chamber. In light of the present disclosure, one of skill in the art could predict and test alternatives for the pre-coating reactant. As will be appreciated by one of skill in the art, there may be other compounds that produce films with the same properties as the DCS-based nitride; namely, a high level of build up of the pre-coating film should be permissible before cleaning is required. In one preferred embodiment, compounds that exhibit a permissible film thickness that is similar to DCS-based nitrides, determined as a function of particle performance, could be used instead of DCS. Preferably, an inorganic substance is used to coat the reaction chamber and other materials that have been cleaned. In a more preferred embodiment, the inorganic substance can be an inorganic silane, such as $SiH_4$, $Si_2H_6$, and $Si_3H_8$. In an even more preferred embodiment, the silane is a chlorosilane, such as, $SiH_3Cl$, $SiHCl_3$, $SiH_2Cl_2$, and $SiCl_4$.

The "product reactants" are the reactants used during deposition onto a workpiece or substrate. In a preferred embodiment, the workpiece is a wafer. In light of the present disclosure, one of skill in the art will recognize that the identity of the product reactant may be different from BTBAS. Preferably, the product reactant is an organic reactant. More preferably, the organic reactant is a source of silicon. Preferably, the product reactant is an organic source of both silicon and nitrogen. In the illustrated embodiment, the product reactant comprises BTBAS.

In light of the present disclosure, one of skill in the art will recognize that ammonia need not be the only chemical used in both or either of the deposition steps. Preferably, however, only inorganic reactants are used in the pre-coating step. Alternative nitrogen sources can be selected from the group consisting of: $(H_3Si)_3N$ (trisilylamine), ammonia, atomic nitrogen, hydrazine $(H_2N_2)$, and hydrazoic acid $(HN_3)$. In another embodiment, nitric oxide is used as a source of nitrogen. In the illustrated embodiment, ammonia is used in both of the deposition steps.

Although a thermally activated $NF_3$ in-situ cleaning process was used in the present experiments, other in-situ cleaning, or etching, processes employing different process conditions, and/or different cleaning gases such as $ClF_3$, $SF_6$, $C_2F_6$, $CF_4$ and/or employing plasma activation of the cleaning gas might be used.

The present embodiment has been demonstrated for a process tube, wafer boat, and rings. As one of skill in the art will appreciate, the invention is not limited to these particular structures for its beneficial or inventive aspects.

Accordingly, it will be appreciated by those skilled in the art that various omissions, addition and modifications can be made to the processes described above without departing from the scope of the invention. All such modifications and changes are intended to fall within the scope of the invention, as defined by the appended claims.

What is claimed is:

1. A process for reducing the loss in deposition rate following the cleaning of a reaction chamber, said process comprising:
   cleaning a reaction chamber;
   pre-coating the reaction chamber with silicon nitride using an inorganic silicon reactant and a pre-coating nitrogen source; and
   depositing silicon nitride on a workpiece in the pre-coated reaction chamber using an organic silicon reactant.

2. The process of claim 1, wherein the inorganic silicon reactant is selected from the group consisting of $SiH_4$, $Si_2H_6$ and $Si_3H_8$.

3. The process of claim 1, wherein the inorganic silicon reactant is selected from the group consisting of $SiH_2Cl_2$, $SiH_3Cl$, $SiHCl_3$, and $SiCl_4$.

4. The process of claim 1, wherein the inorganic silicon reactant is dichlorosilane (DCS).

5. The process of claim 4, wherein pre-coating occurs at approximately 700° C. or greater.

6. The process of claim 1, wherein the pre-coating nitrogen source for pre-coating is an inorganic source of nitrogen.

7. The process of claim 5, wherein the pre-coating nitrogen source is ammonia.

8. The process of claim 1, wherein depositing further comprises using a separate nitrogen source.

9. The process of claim 8, wherein the separate nitrogen source is the same as the pre-coating nitrogen source.

10. The process of claim 1, wherein the organic silicon reactant is bis-tertiary-butyl amino silane (BTBAS).

11. The process of claim 1, wherein the reaction chamber is made from a material selected from the group consisting of quartz, SiC, and silicon-impregnated SiC.

12. A method of treating quartz materials to maintain a relatively constant deposition rate on wafers, said method comprising:
    administering a dichlorosilane-based (DCS-based) silicon nitride pre-coat to quartz materials;

loading a wafer into a reaction chamber having the pre-coated quartz materials; and depositing a film onto the wafer using an organic silicon precursor.

13. The method of claim 12, wherein depositing the film further comprises depositing silicon nitride onto the quartz materials.

14. A method for maintaining a constant rate of deposition for bis-tertiary-butyl amino silane (BTBAS) and ammonia deposition, said method comprising:

cleaning a vertical furnace for batch processing of wafers;

coating surfaces of the cleaned vertical furnace with a dichlorosilane-based layer deposition process; and administering BTBAS and ammonia to a batch of wafers in the coated vertical furnace.

15. A process for reducing surface roughness in a reaction chamber, said process comprising:

cleaning the reaction chamber in-situ, wherein during the cleaning, the wafer boat is in the chamber;

using dichlorosilane (DCS) to deposit a DCS-based film on the reaction chamber, including the wafer boat, while no workpiece is present in the reaction chamber; and subsequently using bis-tertiary-butyl amino silane (BTBAS) to deposit a BTBAS-based layer on a workpiece supported in the reaction chamber.

16. The method of claim 15, wherein the DCS-based film deposition occurs at a temperature of approximately 700° C. or greater and the deposition of the BTBAS-based layer occurs at a temperature of approximately 650° C. or less.

17. A method for operating a reaction chamber for the deposition of silicon nitride films on semiconductor substrates comprising the steps of:

a) carrying out a number of silicon nitride deposition runs on semiconductor wafers in the reaction chamber, using ammonia and bis-tertiary-butyl amino silane (BTBAS) as precursors;

b) after building up a cumulative BTBAS-derived nitride thickness on the reaction chamber, performing an in-situ clean of the reaction chamber by feeding a cleaning gas into the reaction chamber;

c) depositing a nitride precoating on the cleaned reaction chamber using ammonia and dichlorosilane (DCS) as precursors; and d) re-starting the cycle of steps a), b), c) and d) in sequence.

18. The method of claim 17, wherein the temperature while depositing the nitride pre-coating is approximately 700° C. or greater.

19. The method of claim 18, wherein the silicon nitride deposition runs are conducted at less than about 650° C.

20. The method of claim 19, wherein the in-situ clean is conducted at between about 500° C. and 600° C.

* * * * *

UNITED STATES PATENT AND TRADEMARK OFFICE
CERTIFICATE OF CORRECTION

PATENT NO.        : 6,974,781 B2                                        Page 1 of 1
APPLICATION NO.   : 10/690215
DATED             : December 13, 2005
INVENTOR(S)       : Timmermans et al.

It is certified that error appears in the above-identified patent and that said Letters Patent is hereby corrected as shown below:

Column 4,
Line 44, delete "300 mm" and insert -- 300 nm --.

Column 5,
Line 8, delete "500 mm" and insert -- 500 nm --.

Column 6,
Line 10, delete "$(H_2N_2)$" and insert -- $(H_4N_2)$ --.
Line 25, delete "addition" and insert -- additions --.
Line 52, delete "claim 5" and insert -- claim 6 --.

Signed and Sealed this

Twentieth Day of June, 2006

JON W. DUDAS
*Director of the United States Patent and Trademark Office*